(12) United States Patent
Okumura

(10) Patent No.: US 8,259,961 B2
(45) Date of Patent: Sep. 4, 2012

(54) AUDIO PROCESSING APPARATUS AND PROGRAM

(75) Inventor: Hiraku Okumura, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 940 days.

(21) Appl. No.: 12/291,107

(22) Filed: Nov. 6, 2008

(65) Prior Publication Data

US 2009/0122997 A1  May 14, 2009

(30) Foreign Application Priority Data

Nov. 9, 2007 (JP) ................. 2007-291956

(51) Int. Cl.
*H03G 3/00* (2006.01)
*H03G 3/20* (2006.01)

(52) U.S. Cl. .............. 381/104; 381/107; 381/58

(58) Field of Classification Search .......... 381/58, 381/59, 104, 107, 109, 96, 57, 102; 700/94
See application file for complete search history.

(56) References Cited

U.S. PATENT DOCUMENTS

| 5,434,922 | A | | 7/1995 | Miller et al. | |
|---|---|---|---|---|---|
| 5,644,641 | A | * | 7/1997 | Ikeda | 381/94.1 |
| 2004/0125962 | A1 | * | 7/2004 | Christoph | 381/59 |
| 2004/0156510 | A1 | * | 8/2004 | Isaka et al. | 381/59 |

FOREIGN PATENT DOCUMENTS

| EP | 1 619 793 A1 | 1/2006 |
|---|---|---|
| EP | 1 720 249 A1 | 11/2006 |
| JP | 1248799 A | 10/1989 |
| JP | 3306600 | 11/1994 |
| JP | 3286981 | 3/2002 |
| WO | WO 01/80423 A2 | 10/2001 |

OTHER PUBLICATIONS

European Patent Office: European Search Report for Patent Application No. 08168560.4 (Dated: Feb. 24, 2009; 7 pgs.).

* cited by examiner

*Primary Examiner* — Matthew W Such
*Assistant Examiner* — Scott Stowe
(74) *Attorney, Agent, or Firm* — Pillsbury Winthrop Shaw Pittman LLP

(57) ABSTRACT

In an audio processing apparatus, a signal processor controls a volume of a sound signal provided to a sound emitting device. An adaptive filter determines an adaptive signal so as to minimize a magnitude of an error signal. A subtractor generates the error signal represented by a difference between the adaptive signal and an observation signal generated by a sound receiving device. A magnitude ratio calculator calculates a magnitude ratio of the observation signal relative to the error signal or a magnitude ratio of the adaptive signal relative to the error signal for each frame that is sequentially segmented from the error signal along a time axis. A controller variably controls a gain of the volume of the sound signal according to the magnitude of the error signal and the magnitude ratio.

4 Claims, 4 Drawing Sheets

AUDIO PROCESSING APPARATUS AND PROGRAM

BACKGROUND OF THE INVENTION

1. Technical Field of the Invention

The present invention relates to a technology for processing a sound signal provided to a sound emitting device.

2. Description of the Related Art

There have been suggested technologies in which the volume of a sound signal provided to a sound emitting device is automatically controlled according to an observation signal produced from an observation sound that a sound receiving device has received from the sound emitting device. For example, Patent References 1 and 2 have disclosed technologies in which an adaptive filter generates an adaptive signal so as to minimize the magnitude of an error signal corresponding to the difference between the observation signal and the adaptive signal, and the volume of the sound signal is controlled according to the magnitude of the error signal. Ideally, the error signal corresponds to a noise component of the observation sound. Thus, for example, the sound signal is controlled so that the volume of a playback sound from the sound emitting device is raised when the magnitude of the error signal is higher than a reference value for volume control (i.e., when significant noise is present in the environment), and the volume of the playback sound is reduced when the magnitude of the error signal is less than the reference value.

[Patent Reference 1] Japanese Patent Application Publication No. Heisei 1-248799

[Patent Reference 2] Japanese Patent No. 3286981

3. Summary of the Invention

However, in the technologies of Patent References 1 and 2, the magnitude of the error signal may deviate from the magnitude of the actual noise component. For example, when the magnitude of the noise component is significantly lower than the magnitude of a sound that the sound receiving device has received from the sound emitting device, a component other than the noise component in the observation signal may remain in the error signal due to limited capabilities of a subtracter that subtracts the adaptive signal from the observation signal. In such a case, when the magnitude of the error signal is higher than the reference value, the sound signal is controlled to increase the volume of the playback sound and therefore the magnitude of the error signal is further increased. Accordingly, the volume of the playback sound from the sound emitting device continues increasing even though the volume of the playback sound is sufficiently high. In addition, since the magnitude of the error signal including the component other than the noise component is higher than the magnitude of the actual noise component, there is a problem in that the gain of the volume of the sound signal is set somewhat higher than the original level so that the volume of the playback sound is not reduced to an optimal level suitable for the original noise component (or it takes a certain amount of time to reduce the volume of the playback sound to the optimal level).

SUMMARY OF THE INVENTION

The invention has been made in view of such circumstances, and it is an object of the invention to appropriately control the characteristics (for example, volume) of the playback sound according to the observation signal.

In order to achieve the above object, the invention provides an audio processing apparatus connected between a sound emitting device and a sound receiving device, the audio processing apparatus comprising: a signal processor that controls a volume of a sound signal provided to the sound emitting device; an adaptive filter that determines an adaptive signal so as to minimize a magnitude of an error signal; a subtracter that generates the error signal represented by a difference between the adaptive signal and an observation signal generated by the sound receiving device; a magnitude ratio calculator that calculates a magnitude ratio of the observation signal relative to the error signal or magnitude ratio of the adaptive signal relative to the error signal for each frame that is sequentially segmented from the error signal along a time axis; and a controller that variably controls a gain of the volume of the sound signal according to the magnitude of the error signal when the magnitude ratio is less than a reference value, and that controls the gain of the volume of the sound signal so as to suppress an increase of the gain according to the magnitude of the error signal when the magnitude ratio is higher than the reference value.

In addition, the process of "controlling the gain of the volume of the sound signal so as to suppress an increase of the gain according to the magnitude of the error signal" includes at least one of a process for controlling, under the circumstance where the gain would be increased when the gain is controlled based only on the magnitude of the error signal, the gain so that the increase of the gain is suppressed, and a process for controlling, under the circumstance where the gain would be reduced when the gain is controlled based only on the magnitude of the error signal, the gain so that the reduction of the gain is accelerated.

According to this configuration, an increase of the gain of the volume of the sound signal is suppressed when the magnitude ratio is higher than the average magnitude ratio (i.e., when the magnitude of the noise component is reduced). Accordingly, the gain can be quickly and reliably suppressed even when the magnitude of the noise component is rapidly reduced. In addition, when a rapid increase of the magnitude of the noise component is stopped, an increase of the gain after the rapid increase is stopped is suppressed, thereby preventing the problem in that the volume of the sound signal continues increasing after the increase of the magnitude of the noise component is stopped.

In accordance with a preferred embodiment of the invention, the audio processing apparatus further comprises a magnitude ratio averager that calculates an average value of the magnitude ratios averaged over a plurality of frames, wherein the controller controls the gain of the volume of the sound signal using the average value of the magnitude ratios as the reference value.

This embodiment enables appropriate control of the gain according to the magnitude ratio of each frame since the gain is controlled based on the average magnitude ratio over the plurality of frames.

In accordance with a specific embodiment of the invention, the controller calculates a gain Gm from a magnitude Em of an error signal, a reference value Estd of the magnitude Em, a magnitude ratio Rm, an average value of the magnitude ratios Rave, and an immediately previous gain Gm−1 based on Equation (A):

$$Gm = (Gm-1)^{\theta}(Em/Estd)^{\eta}(Rave/Rm)^{\zeta}, \quad (A)$$

where $0 \leq \theta \leq 1$, $0 < \eta \leq 1$, $\zeta = Z$ ($Z>0$) when Rm>Rave, $\zeta=0$ when Rm<Rave, and m=natural number.

The audio processing apparatus according to the invention may not only be implemented by hardware (electronic circuitry) such as a Digital Signal Processor (DSP) dedicated to each process but may also be implemented through cooperation of a general arithmetic processing unit such as a Central Processing Unit (CPU) with a program.

The invention provides a program executable by a computer to perform an audio processing method comprising: a signal process of controlling a volume of a sound signal provided to a sound emitting device; an adaptive filtering process of determining an adaptive signal so as to minimize a magnitude of an error signal; a subtraction process of generating the error signal represented by a difference between the adaptive signal and an observation signal generated by a sound receiving device; a magnitude ratio calculation process of calculating a magnitude ratio of the observation signal relative to the error signal or magnitude ratio of the adaptive signal relative to the error signal for each frame that is sequentially segmented from the error signal along a time axis; and a controlling process of variably controlling a gain of the volume of the sound signal according to the magnitude of the error signal when the magnitude ratio is less than a reference value, and that controls the gain of the volume of the sound signal so as to suppress an increase of the gain according to the magnitude of the error signal when the magnitude ratio is higher than the reference value.

This program achieves the same operations and advantages as those of the audio processing apparatus according to the invention. The program of the invention may be provided to a user through a computer readable medium or machine readable medium storing the program and then be installed on a computer, and may also be provided to a user through distribution over a communication network and then be installed on a computer.

DETAILED DESCRIPTION OF THE INVENTION

A: Embodiment of Audio Processing Apparatus

Figure 1:
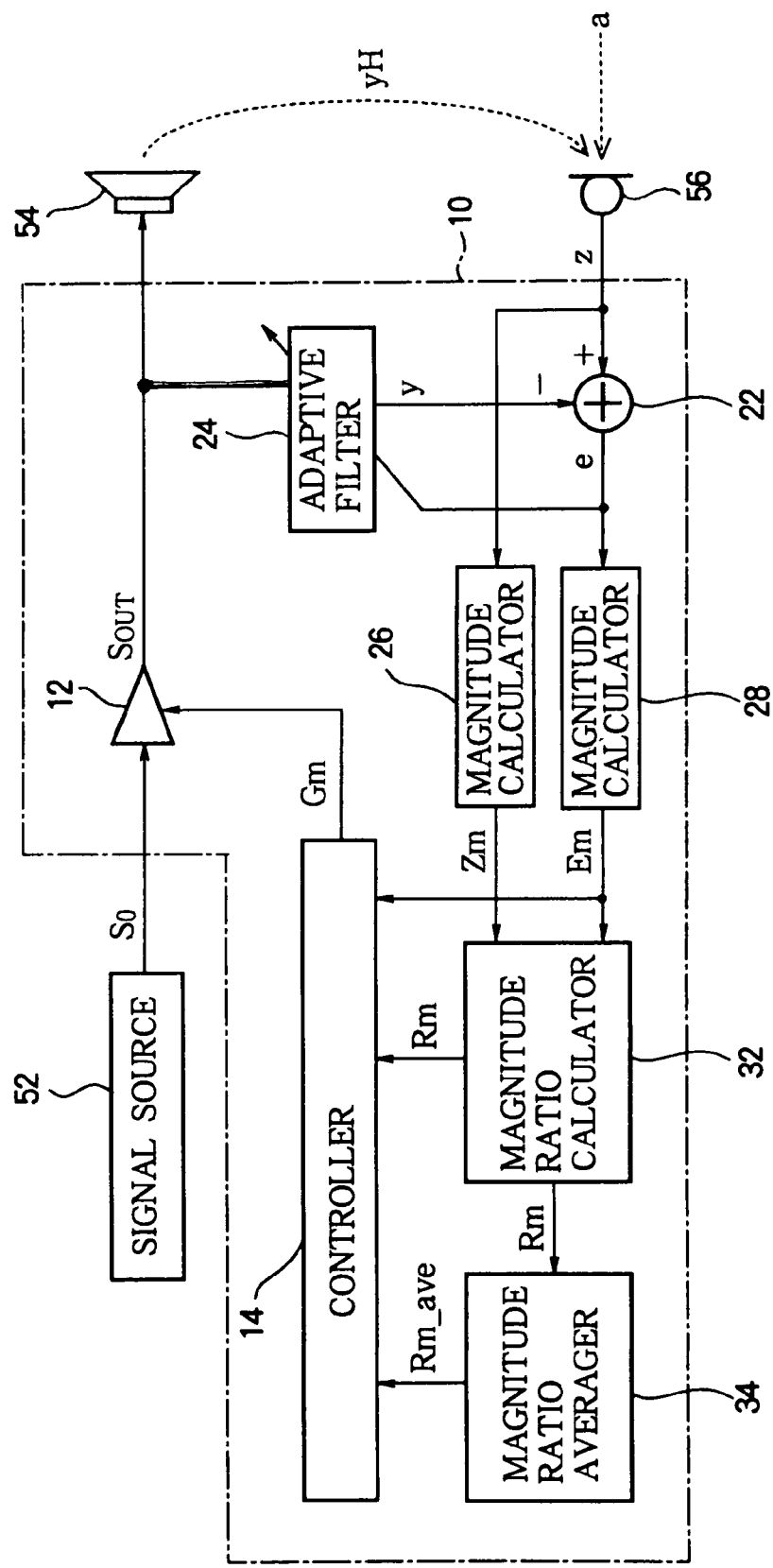
FIG. 1 is a block diagram illustrating the configuration of an audio processing apparatus according to an embodiment of the invention.

FIG. 1 is a block diagram illustrating the configuration of an audio processing apparatus 10 according to a first embodiment of the invention. A signal source 52, a sound emitting device 54, and a sound receiving device 56 are connected to the audio processing apparatus 10. The signal source 52 provides a sound signal $S_0$ to the audio processing apparatus 10. The sound signal $S_0$ is a digital signal representing a waveform on the time axis of a sound (any of a variety of sounds such as a voice or music sound). A playback device that acquires a sound signal $S_0$ from a recording medium and outputs the sound signal $S_0$ to the audio processing apparatus 10 or a communication device that receives a sound signal $S_0$ through a communication network and outputs the sound signal $S_0$ to the audio processing apparatus 10 is preferably adopted as the signal source 52.

The sound emitting device 54 (for example, a speaker) emits a sound wave according to a sound signal $S_{OUT}$ provided from the audio processing apparatus 10. Although the sound signal $S_{OUT}$ is actually provided to the sound emitting device 54 through a D/A converter or an amplifier, illustration of the D/A converter or amplifier is omitted herein for the sake of convenience.

The sound receiving device 56 (for example, a microphone) generates an observation signal z according to a collected sound and provides the observation signal z to the audio processing apparatus 10. The observation signal z represents a waveform of an observation sound containing a noise component of an ambient noise around the sound receiving device 56 and a propagation component yH of a playback sound obtained by applying a transfer function corresponding to a sound wave path from the sound emitting device 54 to the sound receiving device 56 to the playback sound from the sound emitting device 54 (z=yH+a). Although the signal output from the sound receiving device 56 is converted into a digital observation signal z through an amplifier or an A/D converter, illustration of the amplifier or A/D converter is also omitted herein for the sake of convenience.

The audio processing apparatus 10 generates the sound signal $S_{OUT}$ from the sound signal $S_0$ based on the observation signal z. The audio processing apparatus 10 is implemented by an arithmetic processing unit executing a program stored in a recording medium. The following is a detailed description of a functional configuration of the audio processing apparatus 10.

The signal processor 12 of FIG. 1 generates a sound signal $S_{OUT}$ by adjusting (amplifying) the volume of the sound signal $S_0$. The signal processor 12 of this embodiment is a multiplier that outputs the product of the sound signal $S_0$ and a gain Gm as the sound signal $S_{OUT}$ (i.e., $S_{OUT}=S_0 \times Gm$). The gain Gm of the volume of the sound signal $S_0$ is variably controlled by the controller 14. The control of the gain Gm will be described later. The sound signal $S_{OUT}$ produced through processing of the signal processor 12 is output to the sound emitting device 54.

The subtractor 22 generates an error signal e by subtracting an adaptive signal y from the observation signal z generated by the sound receiving device 56. The adaptive filter 24 generates the adaptive signal y based on both the sound signal $S_{OUT}$ produced through processing of the signal processor 12 and the error signal e generated by the subtractor 22. The adaptive filter 24 determines the adaptive signal y so that the magnitude of the error signal e is minimized. Accordingly, the adaptive signal y is a signal simulating (estimating) the waveform of the propagation component yH. The adaptive signal y generated by the adaptive filter 24 is used for the calculation of the subtractor 22.

The magnitude calculator 26 calculates the magnitude (power) Zm of the observation signal z every frame defined on the time axis, where the subscript "m" denotes a natural number indicating the frame number of each frame. The magnitude calculator 28 calculates the magnitude Em of the error signal e every frame. The frames are sequentially segmented from the waveform of the input signal along the time axis. The time length of each frame may have any of a fixed value or a variable value. Here, a configuration wherein adjacent frames on the time axis overlap each other may also be employed. The magnitude Xm (Xm=Zm, Em) of a signal x (x=z, e) of an mth frame is calculated based on the following Equation (1).

$$X_m = \sum_{k=n-N+1}^{n} \|x_k\|^2 \quad (1)$$

In Equation (1), "N" is the number of samples belonging to one frame among a sequence of samples representing the signal x and "n" is a last sample number of the frame.

A magnitude ratio calculator 32 in FIG. 1 calculates a ratio Rm of the magnitude Zm of the observation signal z calculated by the magnitude calculator 26 to the magnitude Em of the error signal e calculated by the magnitude calculator 28. The ratio Rm will be referred to as a "magnitude ratio". That is, the magnitude ratio Rm is a numerical value (Rm=Zm/Em) obtained by dividing the magnitude Zm by the magnitude Em.

A magnitude ratio averager 34 calculates an average magnitude ratio Rm_ave by averaging the magnitude ratio Rm calculated in each frame over a plurality of frames. For example, the average magnitude ratio Rm_ave is calculated as an arithmetic mean value of the magnitude ratio Rm over M frames of an (m−M+1)th frame to an mth frame as shown in the following Equation (2).

$$R_{m\_ave} = \frac{1}{M} \sum_{j=m-M+1}^{m} Rj \quad (2)$$

However, any other method may be employed to calculate the average magnitude ratio Rm_ave. For example, it is preferable to employ a configuration in which a geometric mean of the magnitude ratio Rm over M frames is calculated as the average magnitude ratio Rm_ave or a configuration in which the average magnitude ratio Rm_ave is calculated using the following Equation (3).

$$R_{m\_ave} = \alpha \cdot R_{m-1\_ave} + \beta \cdot R_m \quad (3)$$

(0<α<1, 0<β<1)

The controller 14 controls the operation of the signal processor 12. More specifically, the controller 14 performs the calculation of Equation (4) based on the magnitude Em, the magnitude ratio Rm, and the average magnitude ratio Rm_ave to calculate a gain Gm that the signal processor 12 uses to amplify the sound signal $S_0$.

$$G_m = G_{m-1}^{\theta} \cdot \left(\frac{E_m}{E_{std}}\right)^{\eta} \cdot \left(\frac{R_{m\_ave}}{R_m}\right)^{\zeta_m} \quad (4)$$

In Equation (4), "θ" is appropriately selected from a range of 0 to 1 (i.e., 0≦θ≦1). The higher the magnitude of θ is, the more easily the influence of an immediately previous gain Gm−1 is reflected in the gain Gm. In Equation (4), "η" is appropriately selected from a range of greater than 0 and equal to or less than 1 (i.e., 0<η≦1). For example, an equation "θ=1−η" is satisfied. In addition, "θ" is preferably set to a numerical value greater than "η". In Equation (4), "$E_{std}$" is a numerical value that is a reference of the magnitude Em. This numerical value will be referred to as a "reference value".

In Equation (4), "$\zeta_m$" is set to a predetermined value Z when the magnitude ratio Rm is higher than the average magnitude ratio Rm_ave (Rm>Rm_ave) and is set to zero when the magnitude ratio Rm is equal to or less than the average magnitude ratio Rm_ave (Rm≦Rm_ave). However, "$\zeta_m$" may also be set to a numerical value other than zero when the magnitude ratio Rm is equal to or less than the average magnitude ratio Rm_ave. For example, the predetermined value Z is a positive number. In addition, the predetermined value Z is preferably set to a numerical value less than 1 (for example, Z=0.7).

When the magnitude ratio Rm is equal to or less than the average magnitude ratio Rm_ave, $(Rm\_ave/Rm)^{\zeta_m}$ in Equation (4) is 1 and therefore the gain Gm is controlled according to the magnitude Em of the error signal e. That is, the gain Gm is controlled so that the magnitude Em approaches the magnitude Estd. For example, the gain Gm is increased above the immediately previous gain Gm−1 when the magnitude Em is higher than the reference value Estd and is decreased below the immediately previous gain Gm−1 when the magnitude Em is less than the reference value Estd. On the other hand, when the magnitude ratio Rm is higher than the average magnitude ratio Rm_ave, $(Rm\_ave/Rm)^{\zeta_m}$ in Equation (4) is a numerical value less than 1 and therefore the reduction of the gain Gm is accelerated compared to when the magnitude ratio Rm is less than the average magnitude ratio Rm_ave.

Since the gain Gm is controlled according to the relation between the magnitude ratio Rm and the average magnitude ratio Rm_ave in this embodiment as described above, for example, the gain Gm can be quickly and appropriately controlled according to the noise signal a, compared to a configuration (hereinafter referred to as a "comparison example 1") wherein the gain Gm is calculated based only on the magnitude Em. These advantages are described below in detail with reference to FIGS. 2 to 5. In the comparison example 1, the gain Gm is calculated, for example, using an equation $Gm=Gm-1^{\theta} \cdot (Em/Estd)^{\eta}$.

Figure 2:
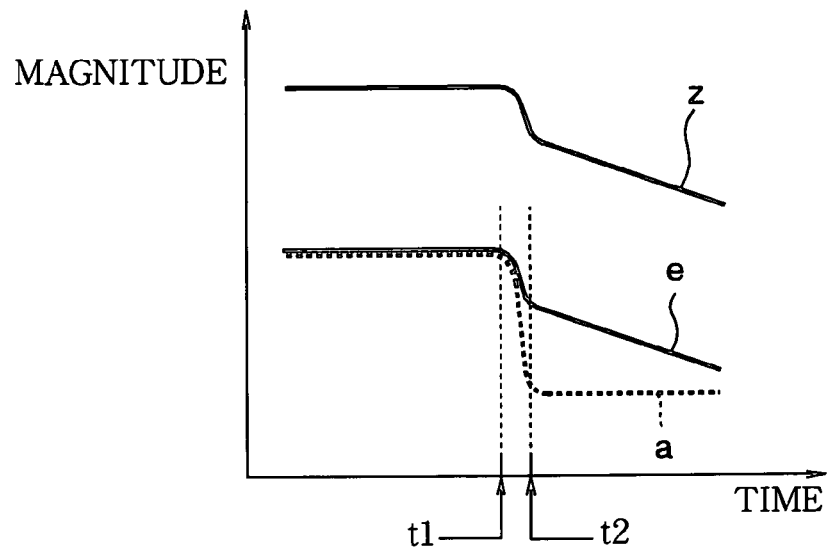
FIG. 2 is a conceptual diagram illustrating how control is performed in a comparison example when a noise component is reduced.
Figure 3:
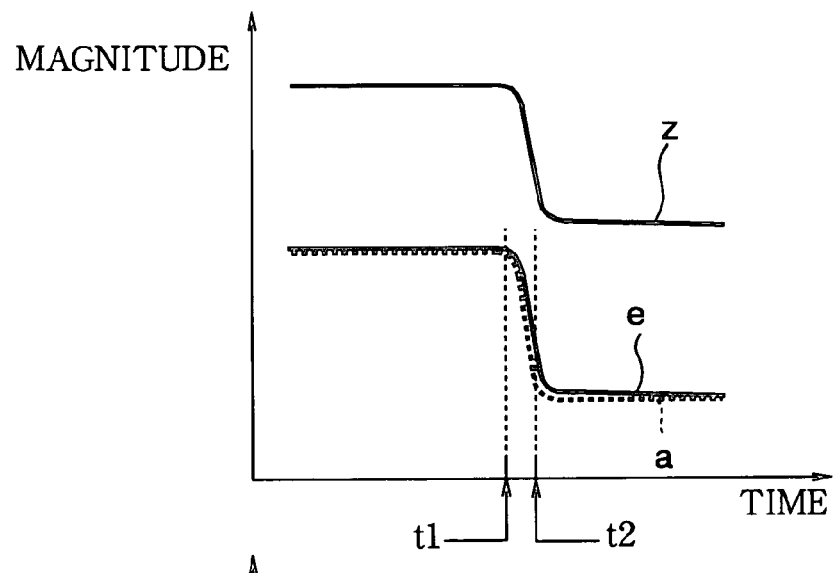
FIG. 3 is a conceptual diagram illustrating how control is performed in the embodiment when the noise component is reduced.
Figure 3:
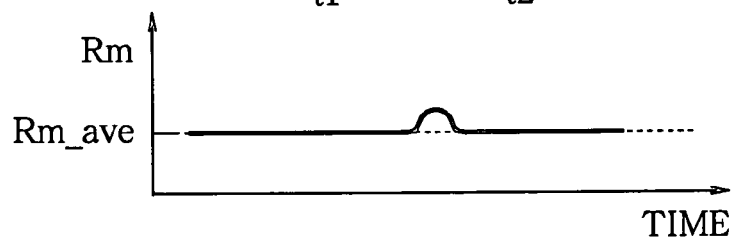
Figure 4:
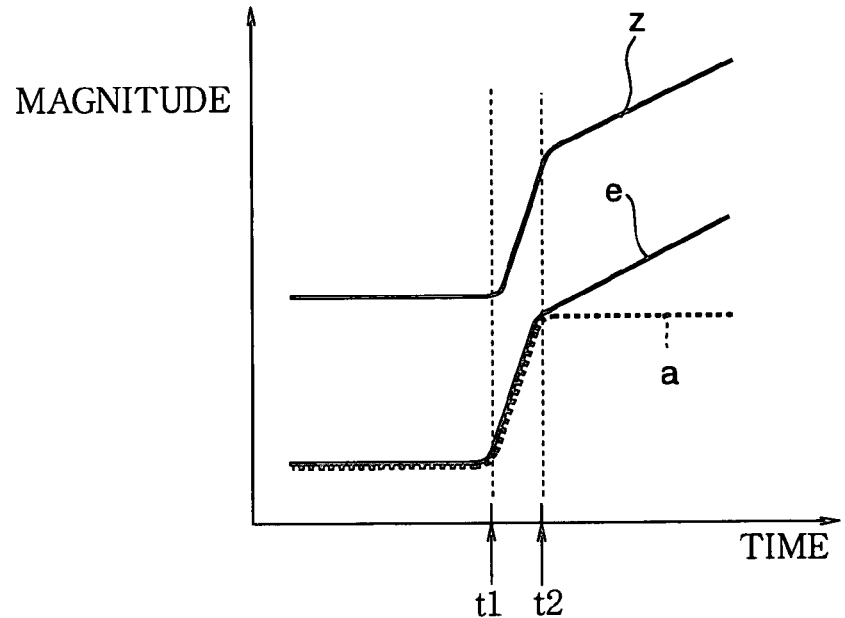
FIG. 4 is a conceptual diagram illustrating how control is performed in the comparison example when the noise component is increased.
Figure 5:
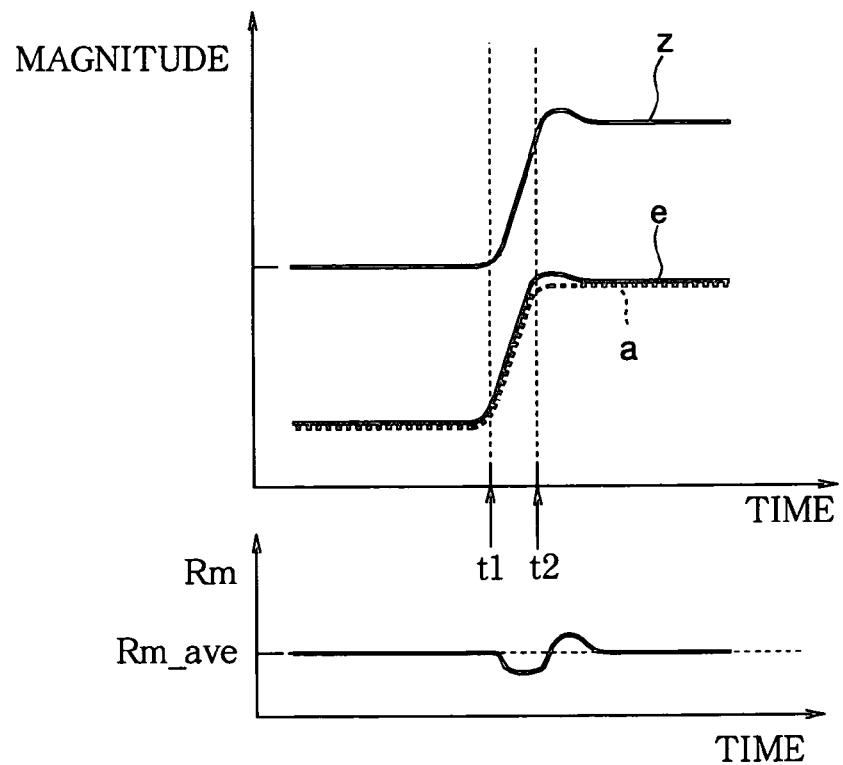
FIG. 5 is a conceptual diagram illustrating how control is performed in the embodiment when the noise component is increased.

FIGS. 2 to 5 are conceptual diagrams illustrating how the magnitude Zm of the observation signal z and the magnitude Em of the error signal e vary over time according to the magnitude A of a noise signal a. In FIGS. 2 and 3, it is assumed that the magnitude A of the noise signal a drops at time t1 and, in FIGS. 4 and 5, it is assumed that the magnitude A of the noise signal a rises at time t1. FIGS. 2 and 4 show the characteristics of the comparison example 1 and FIGS. 3 and 5 show the characteristics of this embodiment. FIGS. 3 and 5 also illustrate how the magnitude ratio Rm varies over time. In FIGS. 3 and 5, illustration of variation of the average magnitude ratio Rm_ave is omitted for the sake of convenience.

When the magnitude A of the noise signal a rapidly drops compared to the magnitude of the propagation component yH, a component that has not been subtracted from the propagation component yH at the subtractor 22 may remain in the error signal e due to limited capabilities of the adaptive filter 24 or the subtractor 22. That is, the magnitude Em of the error signal e is higher than the magnitude A of the actual noise signal a after the time t1 elapses as shown in FIG. 2. Accordingly, in the comparison example 1, the reduction of the volume of the sound signal $S_{OUT}$ is suppressed since the magnitude Em of the error signal e is higher than the magnitude A of the actual noise signal a although it is necessary to significantly reduce the volume of the sound signal $S_{OUT}$ so as to follow the reduction of the magnitude A. That is, the variation of the magnitude Z of the observation signal z (i.e., variation of the volume of a playback sound according to the sound signal $S_{OUT}$) is delayed from the variation of the magnitude A of the noise signal a.

However, as shown in FIG. 3, the magnitude ratio Rm exceeds the average magnitude ratio Rm_ave immediately after the magnitude A of the noise signal a is reduced compared to that of an immediately previous frame since the average magnitude ratio Rm_ave is the average of magnitude ratios Rm of a plurality of (M−1) frames located immediately prior to the mth frame. When the magnitude ratio Rm exceeds the average magnitude ratio Rm_ave (i.e., when the magnitude A is increased), (Rm_ave/Rm)$^{\zeta m}$ in Equation (4) is set to a numerical value less than 1 in this embodiment. That is, a reduction of the gain Gm due to (Rm_ave/Rm)$^{\zeta m}$ is added to the reduction of the gain Gm due to the ratio (Em/Estd)$^\eta$ of the magnitude Em to the reference value Estd. Accordingly, it is possible to quickly and reliably reduce the volume of the sound signal $S_{OUT}$ (i.e., the magnitude Zm of the observation signal z) so as to follow the reduction of the magnitude A of the actual noise signal a as shown in FIG. 3, compared to the comparison example 1 wherein the gain Gm is controlled only according to the magnitude Em of the error signal e.

Reference will now be made to the cases of FIGS. 4 and 5 wherein the magnitude A of the noise signal a rapidly rises at time t1. If the magnitude Em of the error signal e rises together with the magnitude A, the gain Gm also increases. Accordingly, in the comparison example 1, the magnitude Zm of the observation signal z starts rising immediately after time t1 elapses. The magnitude Zm still rises immediately after time t2 at which the magnitude A stops rising since the variation of the magnitude Z of the observation signal z is delayed from the variation of the magnitude A of the noise signal a. Since the magnitude Em of the error signal e rises together with the magnitude Zm, the gain Gm (i.e., the magnitude Zm of the observation signal z) rises according to the magnitude Em of the error signal e even though the increase of the noise signal a is stopped at time t2 as shown in FIG. 4. In addition, even when the magnitude Zm of the observation signal z has been sufficiently increased, the magnitude Em of the error signal e rises since a component that has not been subtracted from the propagation component yH at the subtractor 22 remains in the error signal e due to limited capabilities of the subtractor 22. Since the rise of the magnitude Em causes an increase of the gain Gm, the comparison example 1 has a problem in that the gain Gm continues rising until the volume of the sound signal $S_{OUT}$ (i.e., the propagation component yH) reaches an upper limit as shown in FIG. 4.

If the magnitude Em of the error signal e increases after time t1 elapses, the magnitude ratio Rm is less than the average magnitude ratio Rm_ave (i.e., Rm<Rm_ave) immediately before time t2 and therefore (Rm_ave/Rm)$^{\zeta m}$ in Equation (4) of this embodiment is 1. Accordingly, the magnitude Zm of the observation signal z starts rising immediately after time t1 together with the magnitude A in the same manner as in the comparison example 1 of FIG. 4. If the magnitude A of the noise signal a stops rising at time t2, the magnitude Zm of the observation signal z rises relative to the magnitude Em of the error signal e and therefore the magnitude ratio Rm (Rm=Zm/Em) rises after time t2 elapses as shown in FIG. 5. When the magnitude ratio Rm exceeds the average magnitude ratio Rm_ave (Rm>Rm_ave), the gain Gm begins decreasing so that the volume of the sound signal $S_{OUT}$ starts decreasing as can be understood from Equation (4). Accordingly, the magnitude Zm of the observation signal z stops increasing after time t2 elapses so as to follow the magnitude A of the noise signal a. In this embodiment, when the rapid rise of the magnitude A is stopped at time t2, it is possible to allow the volume of the sound signal $S_{OUT}$ to satisfactorily follow the magnitude A since the equation for calculation of the gain Gm is changed according to whether the magnitude ratio Rm is higher or less than the average magnitude ratio Rm_ave (specifically, the gain Gm is suppressed when the magnitude ratio Rm is higher than the average magnitude ratio Rm_ave) as described above. Accordingly, this embodiment avoids the problem in that the volume of the sound signal $S_{OUT}$ (i.e., the propagation component yH) increases until it reaches the upper limit.

Although the gain Gm is calculated based only on the magnitude Em of the error signal e in the comparison example 1 (i.e., Gm=Gm−1$^\theta$·(Em/Estd)$^\eta$), a configuration (hereinafter referred to as a "comparison example 2") in which the gain Gm is calculated using the magnitude ratio Rm rather than the magnitude Em may also be considered. In the comparison example 2, for example, the gain Gm is controlled so that the magnitude ratio Rm approaches a reference value Rstd (for example, Gm=Gm−1$^\theta$·(Rstd/Rm)$^\eta$). However, the comparison example 2 has the same problem as that of the comparison example 1 described above with reference to FIGS. 2 and 3. That is, this embodiment, wherein the gain Gm is controlled according to the relation between the magnitude ratio Rm and the average magnitude ratio Rm_ave, is also significantly advantageous over the comparison example 2 wherein the gain Gm is calculated using the magnitude ratio Rm.

B: Modified Embodiments

Various modifications as illustrated below can be made to the above embodiments. Two or more embodiments may also be freely selected and combined from the embodiments described below.

(1) Modified Embodiment 1

Figure 6:
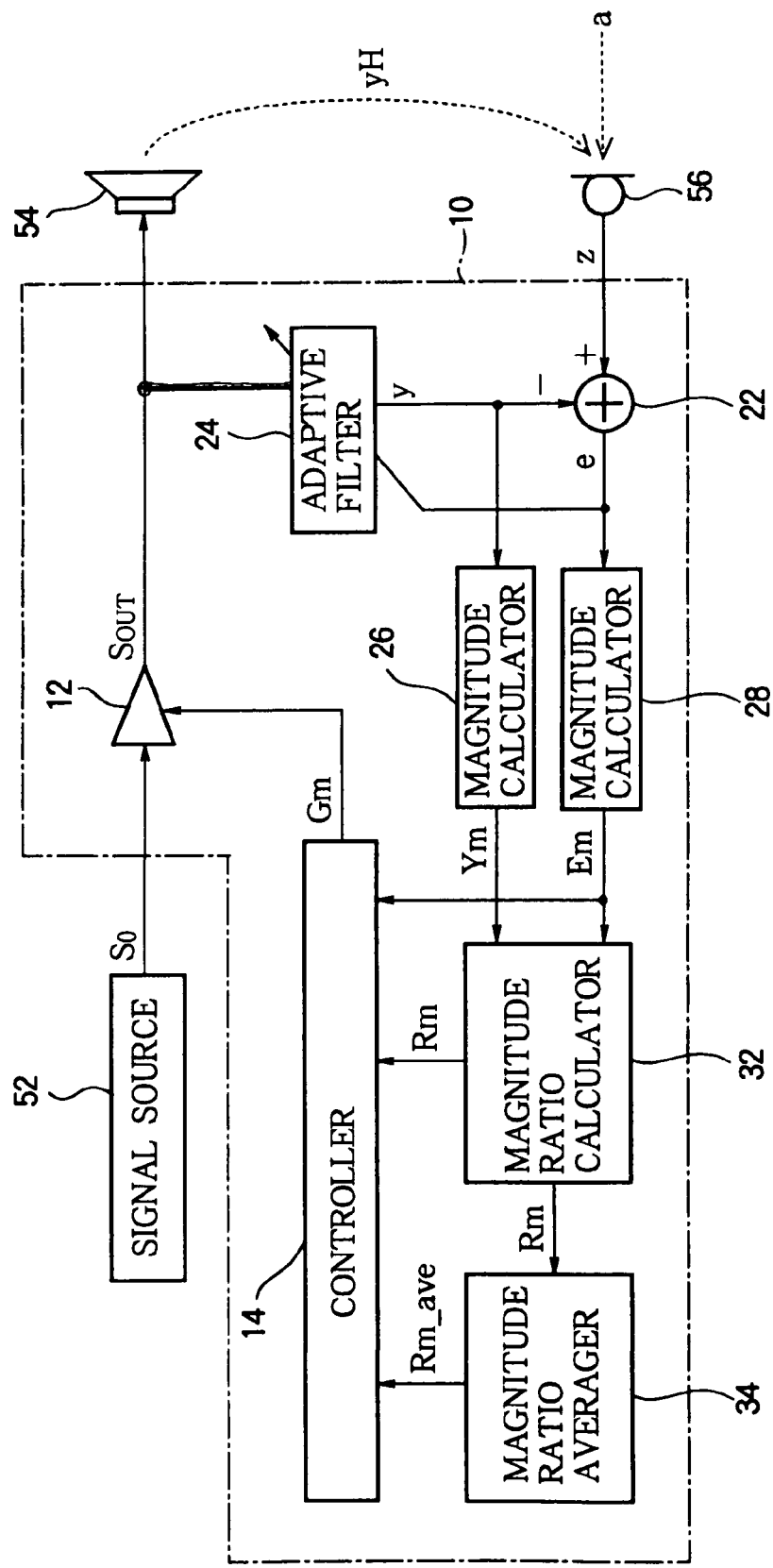
FIG. 6 is a block diagram illustrating the configuration of an audio processing apparatus according to a modified embodiment of the invention.

Although the magnitude ratio Rm is calculated from the magnitude Em of the error signal e and the magnitude Zm of the observation signal z in the above embodiment, the invention may also employ a configuration wherein the magnitude ratio Rm is calculated from the magnitude Em of the error signal e and the magnitude Ym of the adaptive signal y. In the configuration shown in FIG. 6, the magnitude calculator 26 calculates the magnitude Ym of the adaptive signal y using the same method as that of Equation (1). The magnitude ratio calculator 32 calculates the ratio of the magnitude Ym to the magnitude Em as the magnitude ratio Rm (i.e., Rm=Ym/Em). The configuration of FIG. 6 has the same advantages as those of the configuration of FIG. 1.

(2) Modified Embodiment 2

The equation for calculation of the gain Gm is appropriately changed from Equation (4). For example, in Equation (4), the average magnitude ratio Rm_ave may be replaced with a predetermined reference value Rstd. It is also preferable that the gain Gm be calculated using the following Equation (4a).

$$G_m = G_{m-1}^\theta \cdot \left(\frac{E_m}{E_{std}}\right)^\eta \cdot \Lambda_m \tag{4a}$$

In Equation (4a), Λm is set to a predetermined value λ when the magnitude ratio Rm is higher than the average magnitude ratio Rm_ave (i.e., Rm>Rm_ave) and is set to 1 when the magnitude ratio Rm is less than or equal to the average magnitude ratio Rm_ave (i.e., Rm≦Rm_ave). However, Λm may also be set to a numerical value other than 1 when the magnitude ratio Rm is less than or equal to the average magnitude ratio Rm_ave. The predetermined value λ is a positive number less than 1. The same advantages as when Equation (4) is employed are achieved when Equation (4a) is employed. As described above, it is preferable that the gain Gm be variably controlled according to the magnitude Em of the error signal e when the magnitude ratio Rm is less than a predetermined value (average magnitude ratio Rm_ave or reference value Rstd), and be reduced according to the magnitude Em of the error signal e when the magnitude ratio Rm is higher than the predetermined value.

(3) Modified Embodiment 3

Although the average magnitude ratio Rm_ave is calculated from the magnitude ratio Rm calculated for each frame in the above embodiments, the invention may also employ a configuration wherein the magnitude E of the error signal e and the magnitude Z of the observation signal z (or the magnitude Y of the adaptive signal y as in Modified Embodiment 1) are calculated for a period corresponding to a plurality of frames and the magnitude ratio averager 34 calculates the ratio of the magnitude Z to the magnitude E as the average magnitude ratio Rm_ave (i.e., Rm_ave=Z/E).

(4) Modified Embodiment 4

The audio processing apparatus 10 is also implemented using an electronic circuit (DSP) dedicated to processing of the sound signal $S_O$. Each component of the audio processing apparatus 10 may be implemented using a plurality of integrated circuits. For example, a part of the audio processing apparatus 10 may be implemented through cooperation of an arithmetic processing unit with a program while the other part is implemented using a dedicated electronic circuit.

What is claimed is:

1. An audio processing apparatus connected between a sound receiving device and a sound emitting device, the audio processing apparatus comprising:
    a signal processor that controls a volume of a sound signal provided to the sound emitting device;
    an adaptive filter that determines an adaptive signal so as to minimize a magnitude of an error signal;
    a subtractor that generates the error signal represented by a difference between the adaptive signal and an observation signal generated by the sound receiving device;
    a magnitude ratio calculator that calculates a magnitude ratio of the observation signal relative to the error signal or of the adaptive signal relative to the error signal for each frame that is sequentially segmented from the error signal along a time axis; and
    a controller that variably controls a gain of the volume of the sound signal according to the magnitude of the error signal when the magnitude ratio is less than a reference value, and that controls the gain of the volume of the sound signal so as to suppress an increase of the gain according to the magnitude of the error signal when the magnitude ratio is higher than the reference value.

2. The audio processing apparatus according to claim 1, further comprising a magnitude ratio averager that calculates an average value of the magnitude ratio averaged over a plurality of frames,
    wherein the controller controls the gain of the volume of the sound signal using the average value of the magnitude ratio.

3. The audio processing apparatus according to claim 2, wherein the controller calculates a gain Gm based on the following equation:

$$Gm=(Gm-1)^\theta (Em/Estd)^\eta (Rave/Rm)^\xi$$

where Gm−1 is an immediately previous gain, Em represents the magnitude of the error signal, Estd represents a reference of the magnitude Em, Rm represents the magnitude ratio, and Rave represents the average value of the magnitude ratio averaged over the plurality of frames, and where $0 \leq \theta \leq 1$, $0 < \eta \leq 1$, $\xi = Z$ ($Z > 0$) when Rm>Rave, $\xi = 0$ when Rm<Rave, and m=a natural number indicating a frame number.

4. A non-transitory machine readable medium containing a program executable by a computer to perform an audio processing method comprising: a signal process of controlling a volume of a sound signal provided to a sound emitting device; an adaptive filtering process of determining an adaptive signal so as to minimize a magnitude of an error signal; a subtraction process of generating the error signal represented by a difference between the adaptive signal and an observation signal generated by a sound receiving device; a magnitude ratio calculation process of calculating a magnitude ratio of the observation signal relative to the error signal or of the adaptive signal relative to the error signal for each frame that is sequentially segmented from the error signal along a time axis; and a controlling process of variably controlling a gain of the volume of the sound signal according to the magnitude of the error signal when the magnitude ratio is less than a reference value, and that controls the gain of the volume of the sound signal so as to suppress an increase of the gain according to the magnitude of the error signal when the magnitude ratio is higher than the reference value.

* * * * *